United States Patent [19]

Satou

[11] Patent Number: 5,122,927
[45] Date of Patent: Jun. 16, 1992

[54] PORTABLE ELECTRONIC APPARATUS HAVING TERMINAL SUPPORTED FROM THE BOTTOM CASE FOR ELECTRICALLY CONNECTING OPTIONAL PART TO THE APPARATUS AND METHOD OF ASSEMBLING THE SAME

[75] Inventor: Youji Satou, Tokyo, Japan

[73] Assignee: Kabushiki Kaisha Toshiba, Kawasaki, Japan

[21] Appl. No.: 577,543

[22] Filed: Sep. 5, 1990

[30] Foreign Application Priority Data

Oct. 31, 1989 [JP] Japan ................................. 1-283726

[51] Int. Cl.⁵ .......................... H05K 7/02; H05K 7/10; H01M 2/10
[52] U.S. Cl. ...................... 361/392; 429/98; 429/99; 361/380; 361/391
[58] Field of Search .................. 429/96, 97, 98, 99, 429/100; 439/78, 81; 364/708; 361/380, 392, 393, 394, 395, 399, 390, 391; D14/100, 101, 106, 114, 115; 307/150

[56] References Cited

U.S. PATENT DOCUMENTS

| | | | |
|---|---|---|---|
| 4,685,753 | 8/1987 | Isshiki et al. | 439/78 X |
| 4,709,974 | 12/1987 | Hawkins | 439/345 |
| 4,742,478 | 5/1988 | Nigro, Jr. et al. | 364/708 |
| 4,903,222 | 2/1990 | Carter et al. | 364/708 |
| 4,936,787 | 6/1990 | Klein et al. | 439/78 X |
| 4,969,830 | 11/1990 | Daly et al. | 439/347 X |

*Primary Examiner*—Leo P. Picard
*Assistant Examiner*—Michael W. Phillips
*Attorney, Agent, or Firm*—Finnegan, Henderson, Farabow, Garrett and Dunner

[57] ABSTRACT

A portable electronic apparatus includes a main body having a bottom case and a top cover detachably mounted on the bottom case. The top cover is provided with a mounting section to which a battery pack is removably fitted, and a opening open to the mounting section. A terminal stand is mounted in the bottom case, and a connecting terminal is supported on the stand and electrically connected to electronic parts housed in the bottom case. The terminal is covered with a terminal cover except for a contact portion of the terminal. The contact portion projects into the mounting section through the opening and contacts with a power supply terminal of the battery pack. The terminal cover is fitted in the opening so as to close it.

11 Claims, 6 Drawing Sheets

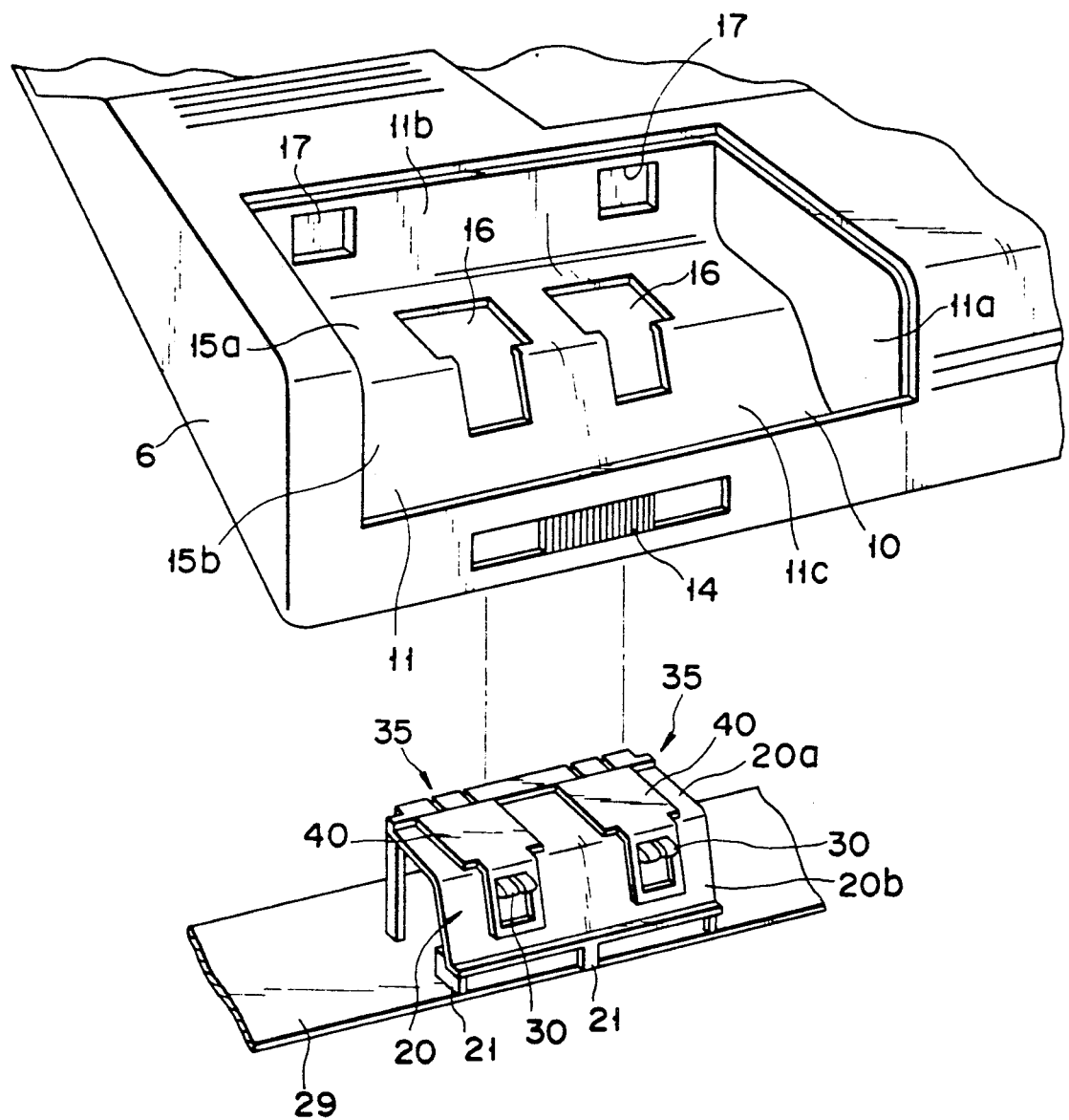
F I G. 3

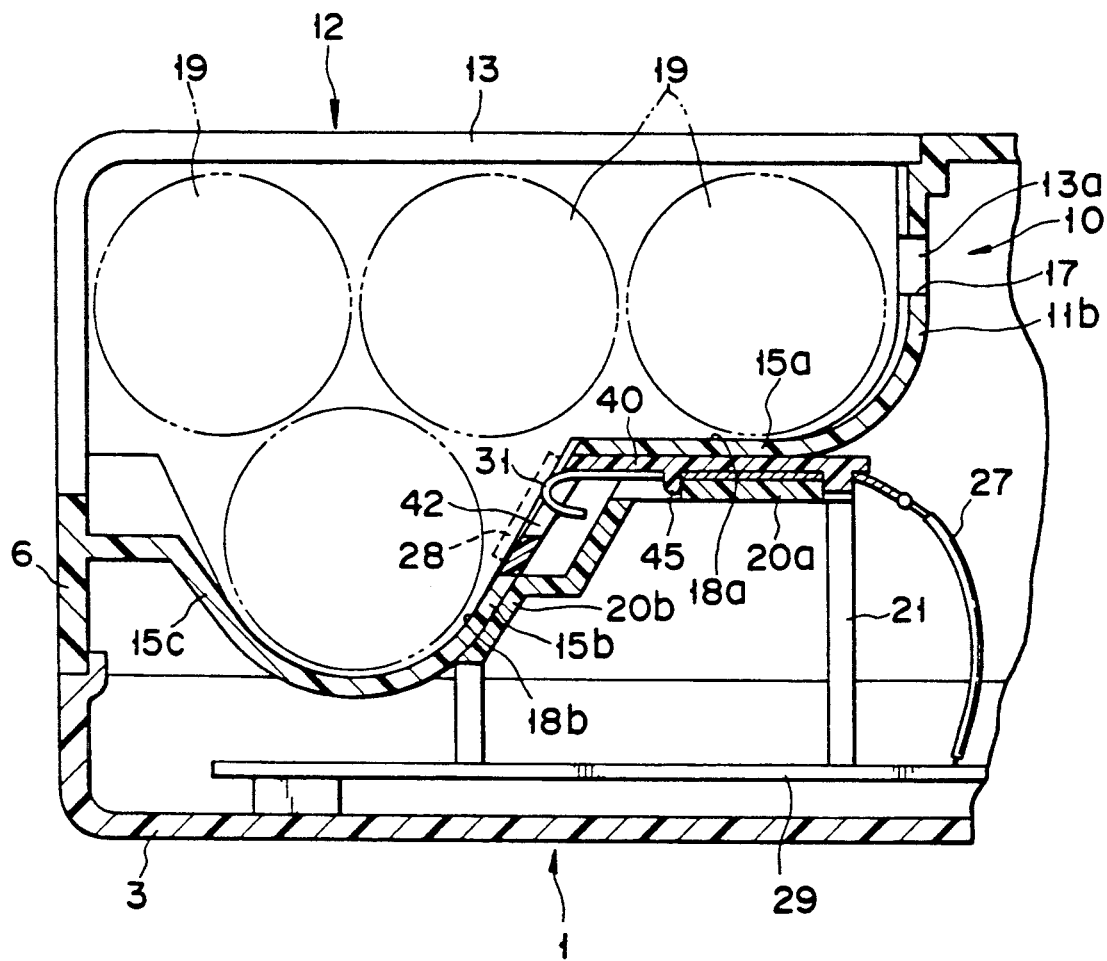
F I G. 7

PORTABLE ELECTRONIC APPARATUS HAVING TERMINAL SUPPORTED FROM THE BOTTOM CASE FOR ELECTRICALLY CONNECTING OPTIONAL PART TO THE APPARATUS AND METHOD OF ASSEMBLING THE SAME

BACKGROUND OF THE INVENTION

1. Field of the Invention

The present invention relates to a portable electronic apparatus such as a personal computer and word processor, which has a terminal for connecting an optional part to the apparatus. The invention also relates to a method of assembling the electronic apparatus.

2. Description of the Prior Art

Personal computers and word processors of the lap top type are becoming remarkably popular among the public.

A portable electronic apparatus of this type includes usually a main body having a keyboard, and a flat panel display rotatably mounted on the main body through hinges. When the display is pivoted onto the keyboard, it also serves as a lid or cover for the keyboard. When the display is closed, the whole of the apparatus becomes flat and compact like a book, for example. This enables the apparatus to be easily carried.

The electronic apparatus of this kind has a battery to enable the apparatus to be used even when no commercial power is available. The battery is detachably attached in a battery housing chamber which is formed in the apparatus body. A connecting terminal is arranged in the housing chamber and electrically connected to electronic parts arranged in the main body. When the battery is fitted in the housing chamber, the terminal is electrically connected to the battery.

Usually, the apparatus body comprises a bottom case and a top cover coupled thereto, both of which are made of insulating resin. The battery housing chamber is sometimes formed on the side of the top cover, depending upon layouts of the apparatus. The connecting terminal is also attached to the top cover in this case, exposing it in the battery housing chamber.

In the case where the connecting terminal is attached to the top cover, however, a wiring for connecting the terminal to the electronic parts on a printed circuit board fixed to the bottom case must be bridged between the top cover and the bottom case. When the top cover and the bottom case are to be separated from and coupled to each other, therefore, it is necessary that the wiring be disconnected from and connected to its corresponding parts. This makes it necessary to use such parts as connectors for disconnecting and connecting the wiring from and to its corresponding parts, thereby increasing the number of parts used. Further, when the top cover is to be coupled to the bottom case, the connectors must be connected thereby making the assembly of the apparatus troublesome.

SUMMARY OF THE INVENTION

The present invention is contrived in consideration of the above circumstances and its object is to provide a portable electronic apparatus having a smaller number of parts, which is easier to assemble, thereby making it unnecessary to use a specific operation for connecting terminals to electronic parts in the main body when the top cover and the bottom case are to be separated from and coupled to each other.

Another object of the present invention is to provide a method of assembling the electronic apparatus.

In order to achieve the above object, according to a portable electronic apparatus of the present invention, a connecting terminal is arranged in the bottom case of the apparatus main body while being supported by supporting means, and the connecting terminal, except for its contact portion, is covered with covering means. The top cover of the main body has a mounting section in which an optional part such as a battery pack is removably fitted, and an opening which is opened to the mounting section and opposite to the connecting terminal. The opening is made sufficiently large in size and the contact portion of the connecting terminal projects in the mounting section through the opening.

According to the electronic apparatus constructed as described above, the connecting terminal is arranged in the bottom case in which the electronic parts are housed. When the bottom case and the top cover are to be separated from and connected to each other, therefore, it is not necessary that wiring for connecting the connecting terminal to the electronic parts be disconnected from and connected to these terminals and parts. In addition, the opening of the top cover is made sufficiently larger in size than the connecting terminal, so that the connecting terminal is prevented from directly contacting the to cover. Even when a plated layer, for example, is formed on the inner face of the top cover so as to shield an electromagnetic wave, therefore, the connecting terminal can be reliably prevented from being electrically connected to the plated layer. Further, except for the contact portion, the connecting terminal is covered by the covering means, so that the connecting terminal is prevented from being exposed outside through the opening.

A method of assembling the portable electronic apparatus according to the present invention comprises the steps of: mounting a connecting terminal on a bottom case of the main body, on which electronic parts are mounted, by means of supporting means; connecting the connecting terminal to the electronic parts; covering the connecting terminal, except for its contact portion, with covering means; and mounting a top cover, which has a mounting section to which an optional part is fitted and an opening open to the mounting section, on the bottom case so that the contact portion of the connecting terminal projects into the mounting section through the opening.

According to this assembly method, it is not necessary that wiring for connecting the connecting terminal to the electronic parts be bridged between the bottom base and the top cover. This enables the assembly of the apparatus to be made easier.

Additional objects and advantages of the invention will be set forth in the description which follows, and in part will be obvious from the description, or may be learned by practice of the invention The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 through 7 show a laptop type personal computer according to an embodiment of the present invention, in which FIG. 1 is a perspective view showing the whole of the computer;

FIG. 2 is a perspective view showing the rear side of the computer from which a battery pack is detached;

FIG. 3 is an exploded perspective view showing a top cover and a terminal section;

FIG. 4 is an exploded perspective view showing a terminal stand, a connecting terminal and a terminal cover;

FIG. 5 is an exploded perspective view showing the inside of the terminal cover and the connecting terminal;

FIG. 6 is a perspective view showing the bottom side of the battery pack; and

FIG. 7 is a sectional view showing an essential part of the computer in which the battery pack is fitted to the main body.

DETAILED DESCRIPTION OF THE PREFERRED EMBODIMENTS

An embodiment wherein the present invention is applied to a laptop type personal computer will be described in detail with reference to the accompanying drawings.

Figure 1:
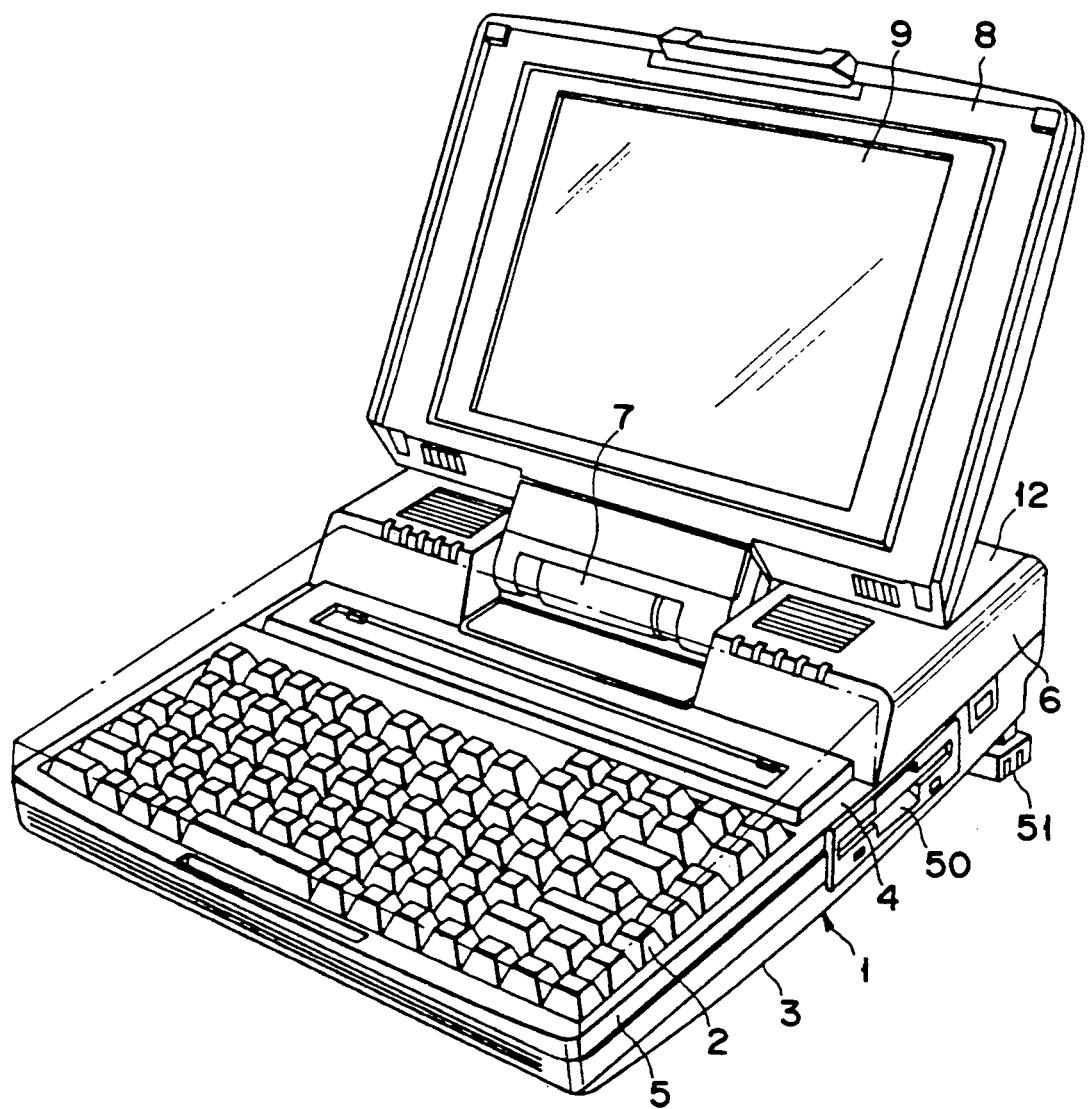
Figure 2:
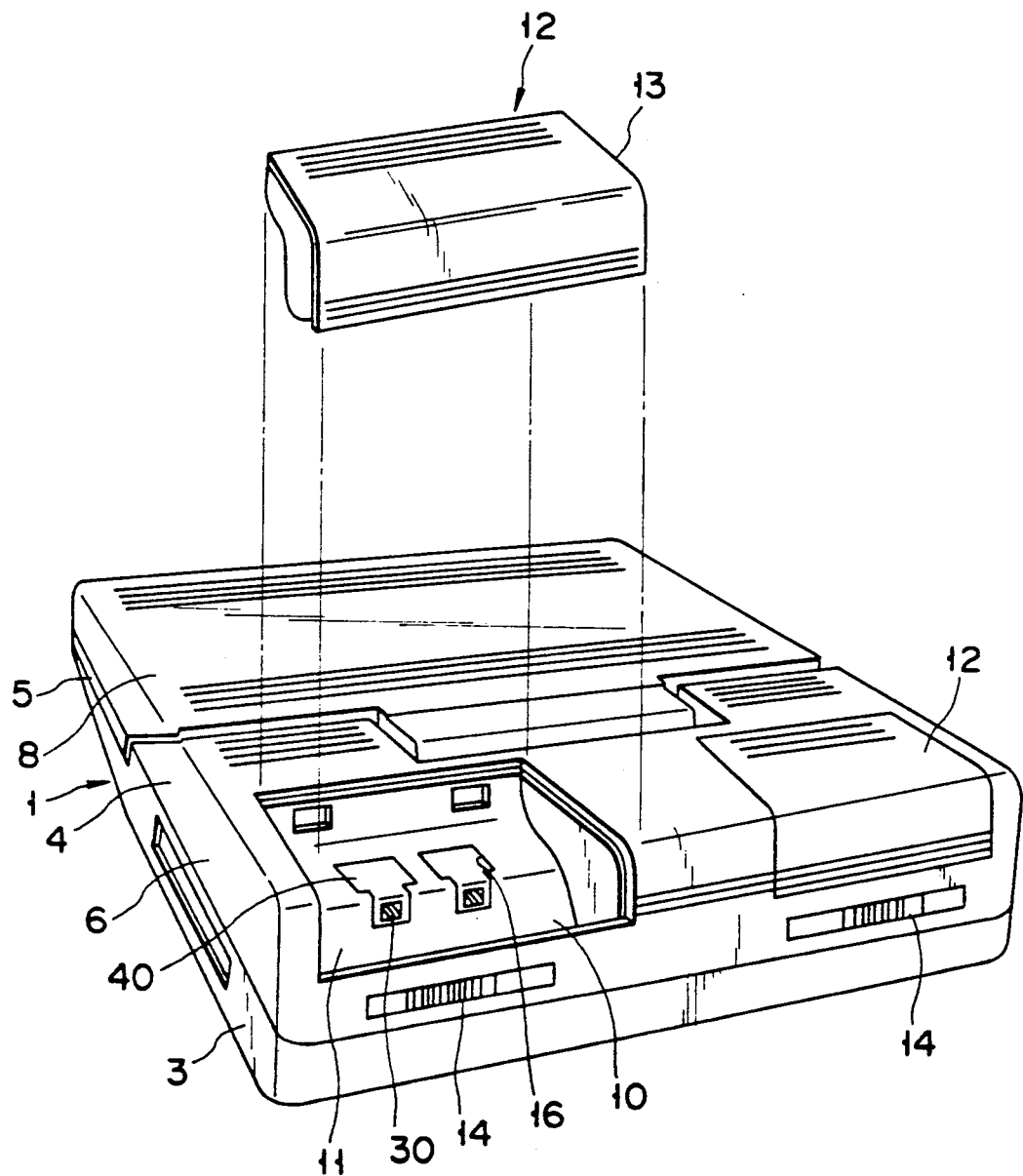

As shown in FIGS. 1 and 2, the computer has a substantially flat box-like main body 1. The main body 1 is thin at the front portion thereof but thick at the rear portion thereof, and a keyboard 2 is integrally mounted on the front portion. The main body 1 comprises a rectangular bottom case 3 which is open at the top thereof, and a top cover 4 fitted on the bottom case 3. The top cover 4 includes a front top cover 5 serving as a keyboard frame, and a rear top cover 6. The front top cover 5 is lower in height than the rear top cover 6 and the keyboard 2 is held by the front top cover 5. Although not shown, shield treatment, that is, metal plating, for example, is applied to the inner faces of the bottom case 3 and the top cover 4 so as to prevent electromagnetic waves from leaking out from the computer.

A hinge 7 is arranged at the front center of the rear top cover 6 and a flat panel display 8 is pivotally mounted to the rear top cover 6 by means of the hinge 7. The display 8 is of the liquid crystal or plasma display type and it has a display screen 9 at the center portion thereof. When the computer is not used or it is to be carried by hand, the display 8 is pivoted to a position, shown by a dot and dash line in FIG. 1, so as to cover the keyboard 2. The whole of the computer is thus made compact, like a flat box.

As shown in FIGS. 2, 3 and 7, a pair of battery mounting sections 10 are formed in the rear portion of the rear top cover 6 (only one section 10 is shown). Each of the mounting sections 10 is formed of a recess open to the top and rear faces of the rear top cover 6. Each of the recesses is defined by a partition wall 11 integral with the cover 6. Battery packs 12 as optional parts are detachably fitted in these mounting sections 10.

The partition wall 11 includes a pair of parallel side walls 11a, a front wall 11b, and a bottom wall 11c. The bottom wall 11c includes a horizontal portion 15a extending backward and parallel to the top of the cover 6, a first slope 15b obliquely extending downward from the horizontal portion 15a, and a second slope 15c obliquely extending upward from the first slope 15b to the backside of the cover 6. The bottom wall 11c is provided with a pair of openings 16 each extending from the horizontal portion 15a to the first slope 15b. Thus, the mounting section 10 communicates with the interior of the main body 1 through these openings 16. The front wall 11b is provided with a pair of engaging holes 17.

Figure 6:
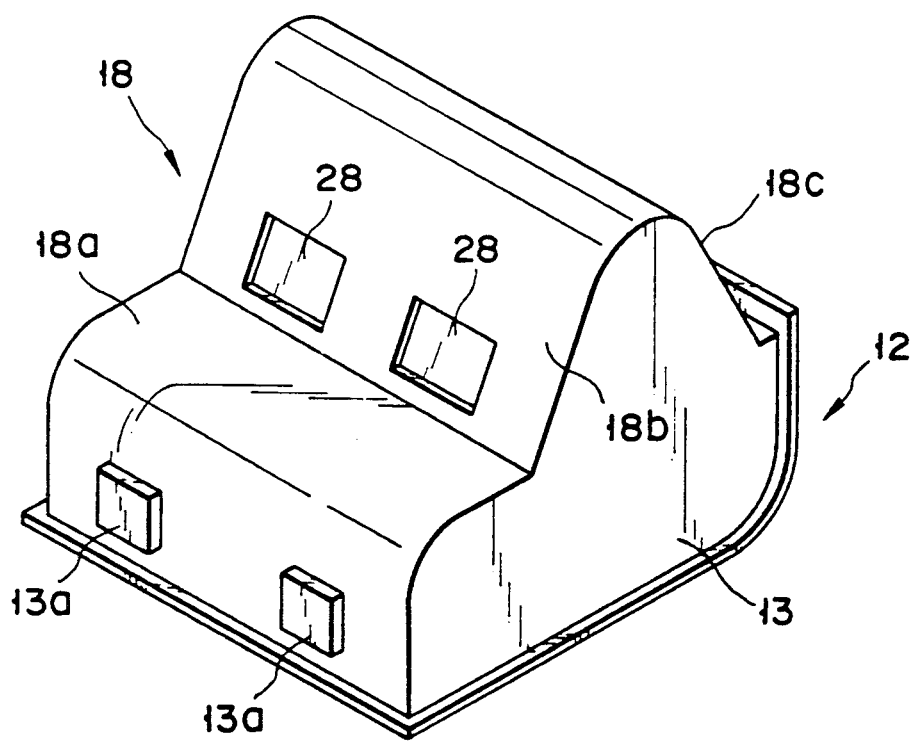

As shown in FIGS. 2, 6, and 7, each of the battery packs 12 has a case 13 shaped to fit the battery mounting section 10, and a plurality of dry cells 19, for example eight, housed in the case 13. Specifically, the case 13 has top and rear walls which constitute a part of the top and rear faces of the rear top cover 6 when the case 13 is fitted in the mounting section 10. The case 13 further has a bottom wall 18 shaped to fit the bottom wall 11c of the partition wall 11. More specifically, the bottom wall 18 of the case 13 has a horizontal portion 18a extending parallel to the top wall of the case 13, a first slope 18b obliquely extending downward from the horizontal portion 18a, and a second slope 18c obliquely extending upward from the first slope 18b to the backside of the case 13. A projecting portion formed by the first and second slopes 18b and 18c is fitted in a recess which is defined by the first and second slopes 15b and 15c of the mounting section 10, and the horizontal portion 18a is seated on the horizontal portion 15a of the mounting section 10. The first slope 18b of the case 13 is provided with a pair of openings, in which are fitted power supply terminal plates 28 connected to the dry cells 19, respectively. These terminal plates 28 are exposed outside of the case 13 and face the openings 16 of the mounting section 10, respectively. Further, the front wall of the case 13 is provided with a pair of engaging protrusions 13a, which are fitted into the engaging holes 17 of the mounting section 10 when the battery pack 12 is fitted in the section 10.

When the battery pack 12 is set in the mounting section 10, it is locked in the section 10 by a lock mechanism (not shown). The lock of the battery pack can be released by sliding a knob 14 provided on the backside of the rear top cover 6.

As shown in FIGS. 3 to 5 and 7, a terminal stand 20, which serves as supporting means, is fixed on the bottom case 3, located under the corresponding mounting section 10 of the rear top cover 6. The terminal stand 20 is made of insulating resin and has a plurality of legs 21, which are fixed to a printed circuit board 29 as one of electronic parts. The circuit board 29 has a predetermined printed wiring (not shown), and is mounted with various kinds of parts. The circuit board 29 is attached to the bottom wall of the bottom case 3 by screws and thus housed in the main body 1.

The terminal stand 20 has a top plate 20a parallel to the circuit board 29 and a slant plate 20b obliquely extending downward from the top plate 20a, and these plates 20a and 20b are located adjacent to the horizontal portion 15a and the first slop 15b of the bottom wall 11c which defines the mounting section 10. The terminal stand 20 is provided with a pair of holding portions 35 for holding connecting terminals which will be described later.

Each of the holding portions 35 has a pair of engaging grooves 22 formed on the front end portion of the top plate 20a, and a fitting recess 23 formed on the slant plate 20b. A pair of engaging holes 24 are formed in the fitting recess 23. In addition, the holding portion 35 is provided with insertion holes 25 and 26 which are formed in the top plate 20a and spaced apart from each other in back and forth direction of the main body 1.

Figure 4:
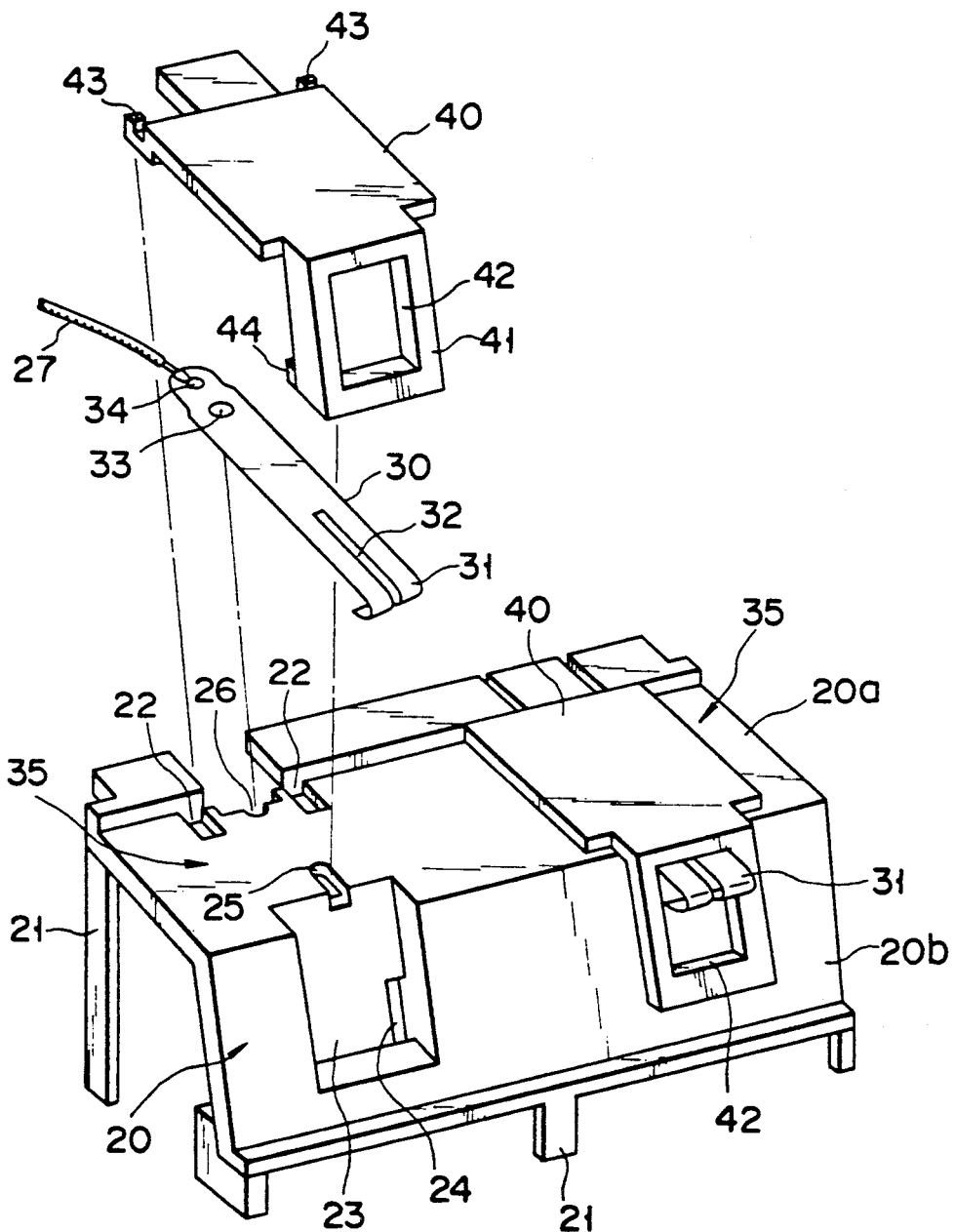
Figure 5:
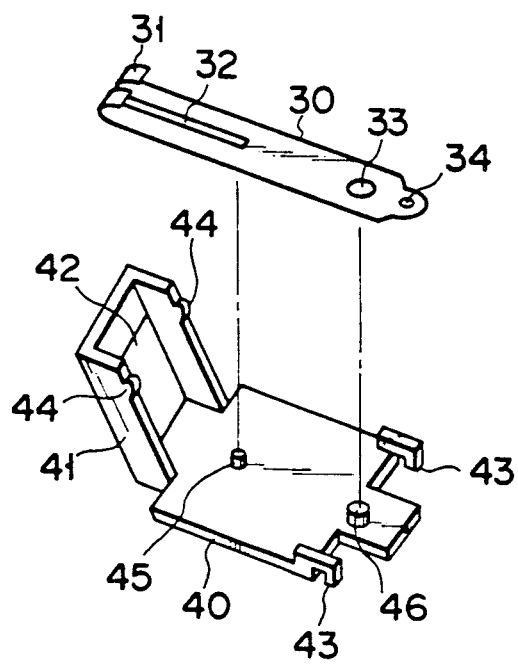

A connecting terminal 30 for receiving electric power is attached to each of the holding portions 35 of the terminal stand 20. The connecting terminal 30 is formed of an elongated metal piece excellent in conductivity and elasticity. As shown in FIGS. 4 and 5, the terminal 30 has a distal end portion constituting an elastically deformable contact portion 31, and a slit 32 cut in the center of the distal end portion and extending in the longitudinal direction thereof. Fixing hole 33 and connecting hole 34 are formed in the proximal end portion of the terminal 30. This connecting terminal 30 is mounted on the upper face of the top plate 20a while the contact portion 31 projects backward from the terminal stand 20. One end of a wire 27 is soldered to the connecting hole 34 of the terminal 30. The other end of the wire 27 is soldered to the printed circuit board 29.

Each of the connecting terminals 30 is fixed to the holding portion 35 of the terminal stand 20 by means of a terminal cover 40 which covers the whole of the connecting terminal 30 except the contact portion 31. More specifically, the terminal cover 40 is made of insulating resin and larger in size than the connecting terminal 30. The cover 40 is formed in a shape corresponding that of the opening 16 at the bottom wall 11c of the mounting section 10, and fitted in the opening 16. Further, the cover 40 is bent to contact the top and slant plates 20a and 20b of the terminal stand 20.

A slant wall 41 of the terminal cover 40 is shaped to fit into the fitting recess 23 on the slant plate 20b of the stand 20, and provided with a through hole 42 through which the contact portion 31 of the connecting terminal 30 extends. The terminal cover 40 is provided with engaging pawls 43 and 44 corresponding to the engaging holes 22 and 24 of the terminal stand 20. When these engaging pawls 43 and 44 are engaged in the engaging holes 22 and 24, the terminal cover 40 is detachably fixed to the terminal stand 20. As shown in FIG. 5, engaging projections 45 and 46 project from the inner face of the terminal cover 40 and are inserted into the insertion holes 25 and 26 of the terminal stand 20, passing through the slit 32 and fixing hole 33 of the connecting terminal 30, respectively.

When the connecting terminal 30 is mounted on the terminal stand 20, extending its contact portion 30 backward from the terminal stand 20, and the terminal cover 40 is mounted on the connecting terminal 30, engaging its pawls 43 and 44 with the holes 22, 24 of the terminal stand 20, therefore, the terminal cover 40 is fixed to the terminal stand 20 and the terminal 30 is sandwiched between the top plate 20a of the stand 20 and the cover 40. Further, the projections 45 and 46 on the inner face of the terminal cover 40 are inserted into the insertion holes 25 and 26 of the terminal stand 20, passing through the slit 32 and the fixing hole 33 of the terminal 30, respectively, so that the terminal 30 can be fixed unmovable. Under this condition, the contact portion 31 of the connecting terminal 30 projects backward from the terminal cover 40, passing through the hole 42 of the terminal cover 40.

When the top cover 4 is mounted on the bottom case 3, the terminal covers 40 are fitted into the leading openings 16 at the partition wall 11 of the mounting section 10 to close the openings 16. The contact portions 31 of the connecting terminals 30 project inside the mounting section 10, thus being capable of contacting the terminal plates 28 of the battery pack 12. As shown in FIG. 7, therefore, when the battery pack 12 is fitted in the mounting section 10, the contact portions 31 of the connecting terminals 30 elastically contact the terminal plates 28 of the battery pack 12. As the result, the printed circuit board 29 in the main body 1 is electrically connected to the dry cells 19 in the battery pack 12 via the wires 27, connecting terminals 30, and terminal plates 28.

In FIG. 1, reference numeral 50 represents a floppy disk drive and reference numeral 51 denotes a stand for tilting the main body 1.

According to the computer arranged as described above, the connecting terminals 30 are attached to the terminal stands which are fixed to the bottom case 3. When the bottom case and the top cover are to be separated from and coupled to each other, therefore, it is not necessary that each of the wires 27, which connect the terminals 30 to the printed circuit board 29 or parts on the board 29 be disconnected from and connected to its corresponding parts. Therefore, specific connectors for connecting the wires to its corresponding parts are not needed. This enables the number of parts used to be reduced, the assembly of the computer to be facilitated, and the wiring to be shortened.

Each of the openings 16 of the top cover is made sufficiently larger in size than the connecting terminal 30, thereby preventing the terminal 30 from directly contacting the top cover 4. Even when a metal plating layer, for example, is formed on the inner face of the top cover 4 so as to shield electromagnetic waves, therefore, the connecting terminals 30 can be reliably prevented from being electrically connected to the metal plating layer. Further, each connecting terminal 30, except for the contact portion 31, is covered by the terminal cover 40. This prevents the connecting terminals 30 from being exposed inside the mounting section 10 through the openings 16, thereby enabling the section 10 to have a good appearance. In addition, the opening 16 are closed by the terminal covers 40, thereby preventing dust from entering into the main body 1.

According to the computer arranged as described above, it is not needed that wirings for connecting the terminals 30 to the printed circuit board 29 bridge the bottom case and the top cover. This enables the process of assembling the computer to be made easier. Particularly in the case of this example, each of the connecting terminals 30 is sandwiched between the terminal stand 20 and the terminal cover 40 which is fixed to the stand by engaging the pawls 43 and 44 of the cover 40 with the holes 22 and 24 of the stand 20. Further, the terminal 30 is held immovably by the projections 45 and 46 on the inner face of the terminal cover 40, which are fitted into the insertion holes 25 and 26 of the terminal stand 20 after passing through the slit 32 and fixing hole 33 of the terminal 30. Therefore, the attaching of the terminal cover 40 and terminal 30 to the terminal stand 20 can be made easier. This makes it unnecessary to use specific fixing members such as screws.

Further, the bottom wall 18 of the battery pack 12 has the first slope 18b obliquely extending downward, and the power supply terminal plates 28 are arranged at this first slope 18b. The contact portion 31 of each of the connecting terminals 30 projects from the first slope 15b of the mounting section 10 to elastically contact the terminal plate 28. Therefore, even when the battery pack 12 is slightly shifted in horizontal and/or vertical directions in the mounting section 10, the contact portions 31 can be securely held in contact with the terminal plates 28.

It should be understood that the present invention is not limited to the above-described embodiment, and various changes and modifications can be applied without departing from the scope of the present invention.

Although each of the terminal covers 40 have served to close the whole of the opening 16 of the mounting section 10 as well as to cover substantially the whole connecting terminal 30, it may serve only to cover the connecting terminal 30.

The means for fixing the terminal covers 40 to the terminal stand 20 is not limited to the combination of the engaging pawls and engaging holes. They may be fixed by screws. The fixing of the connecting terminals 30 to the terminal stand 20 may be made using screws, caulking, and the like.

The application of the present invention is not limited to personal computers, word processors and those electronic apparatuses which are provided with a keyboard and display, but it may be applied to other portable electronic apparatuses.

What is claimed is:

1. A portable electronic apparatus comprising:
   a main body having a bottom case which encloses electronic parts, and a top cover detachably attached to the bottom case;
   a connecting terminal having a contact portion and electrically connected to the electronic parts;
   supporting means fixed on the bottom case, supporting the connecting terminal thereon;
   means for covering the connecting terminal except for the contact portion, said covering means attached to said supporting means;
   said top cover including a mounting section, and an opening which opens to the mounting section and faces the connecting terminal when the top cover is attached to the bottom case, and said contact portion of the connecting terminal projecting into the mounting section through the opening; and
   an optional part detachably fitted in the mounting section and having a connecting portion contacting with the contact portion of the connecting terminal.

2. An apparatus according to claim 1, wherein said opening has an area larger than an area of the connecting terminal, and said covering means has a terminal cover attached to the supporting means and located in said opening.

3. An apparatus according to claim 2, wherein said terminal cover is disposed in said opening so as to close said opening, and the contact portion of the connecting terminal projects through the terminal cover into the mounting section.

4. An apparatus according to claim 2, wherein said terminal cover is detachably attached to the supporting means, and the connecting terminal is clamped between the terminal cover and the supporting means.

5. An apparatus according to claim 4, wherein said supporting means includes a terminal stand fixed to the bottom case and facing the mounting section, the terminal stand having a plurality of engaging holes, and said terminal cover has a plurality of engaging projections engaged with the engaging holes, respectively.

6. An apparatus according to claim 5, wherein said connecting terminal has a fitting hole, and at least one of said engaging projections of the terminal cover extends through said fixing hole and is engaged with one of said plurality of engaging holes of the terminal stand.

7. An apparatus according to claim 1, wherein said optional part is a battery pack having a plurality of dry cells therein and wherein said connecting portion is a power supply terminal electrically connected to said battery pack.

8. An apparatus according to claim 1, wherein said top cover further includes top and rear faces and said mounting section is defined by a recess open to said top and rear faces of the top cover, the top cover further including a partition wall which defines said recess and has said opening, the partition wall having a horizontal portion substantially parallel to the top face of the top cover and a sloped portion obliquely extending from the horizontal portion toward said bottom case;
   said contact portion of the connecting terminal projects through said sloped portion of said partition wall into said recess; and
   said optional part includes a case shaped to fit the recess, the case having a bottom wall provided with a horizontal portion and a sloped portion which are located adjacent and opposing the horizontal portion and the sloped portion of the partition wall, respectively, and said connecting portion of the optional part is provided at the sloped portion of the case.

9. A method of assembling a portable electronic apparatus comprising the steps of:
   fixing supporting means on a bottom case of the apparatus, on which electronic parts are mounted;
   mounting a connecting terminal on the supporting means;
   connecting the connecting terminal to the electronic parts;
   covering the connecting terminal, except for a contact portion of the connecting terminal, by covering means; and
   mounting a top cover, which has a mounting section for receiving an optional part and an opening open to the mounting section, on the bottom case so that the contact portion of the connecting terminal projects into the mounting section through the opening.

10. A method according to claim 9, wherein said step of covering the connecting terminal includes attaching a cover member to the supporting means so as to sandwich the connecting terminal between the cover member and the supporting means.

11. A method according to claim 10, wherein said step of mounting the top cover to the bottom case includes fitting the terminal cover into said opening.

* * * * *

UNITED STATES PATENT AND TRADEMARK OFFICE
CERTIFICATE OF CORRECTION

PATENT NO.  : 5,122,927
DATED       : June 16, 1992
INVENTOR(S) : Youji Satou

It is certified that error appears in the above-identified patent and that said Letters Patent is hereby corrected as shown below:

On the Title page, item [57]
Abstract, line 5, before "opening" change "a" to --an--.

Claim 6, column 8, line 8, change "fitting" to --fixing--.

Signed and Sealed this

Twenty-first Day of December, 1993

Attest:

BRUCE LEHMAN

Attesting Officer

Commissioner of Patents and Trademarks